(12) United States Patent
Nakamura

(10) Patent No.: US 11,711,889 B2
(45) Date of Patent: Jul. 25, 2023

(54) SHIELD CASE AND ELECTRONIC CIRCUIT MODULE

(71) Applicant: LAPIS Semiconductor Co., Ltd., Yokohama (JP)

(72) Inventor: Mitsuhiro Nakamura, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 177 days.

(21) Appl. No.: 17/211,796

(22) Filed: Mar. 24, 2021

(65) Prior Publication Data

US 2021/0307154 A1 Sep. 30, 2021

(30) Foreign Application Priority Data

Mar. 27, 2020 (JP) ................................. 2020-057114

(51) Int. Cl.
*H05K 1/02* (2006.01)
*H05K 3/34* (2006.01)
*H05K 9/00* (2006.01)

(52) U.S. Cl.
CPC .......... *H05K 1/023* (2013.01); *H05K 3/3442* (2013.01); *H05K 9/0028* (2013.01)

(58) Field of Classification Search
CPC H05K 1/02; H05K 1/023; H05K 1/14; H05K 1/141–147; H05K 1/18; H05K 1/181–187; H05K 9/00; H05K 9/0024–0032; H05K 3/34; H05K 3/3442
USPC ................... 361/752, 800, 816, 818; 174/51, 174/350–359; 257/659–660, 704–710
See application file for complete search history.

(56) References Cited

U.S. PATENT DOCUMENTS

| | | | | |
|---|---|---|---|---|
| 4,754,101 A | * | 6/1988 | Stickney | H05K 9/0032 174/DIG. 35 |
| 5,354,951 A | * | 10/1994 | Lange, Sr. | H05K 9/0032 174/DIG. 35 |
| 5,365,410 A | * | 11/1994 | Lonka | H05K 9/0026 174/382 |
| 5,895,884 A | * | 4/1999 | Davidson | H05K 9/0032 174/372 |
| 6,930,891 B1 | * | 8/2005 | Hama | H05K 9/0026 361/753 |
| 6,989,994 B2 | * | 1/2006 | Maguire | H05K 1/0215 29/830 |

(Continued)

FOREIGN PATENT DOCUMENTS

JP 2016114695 6/2016

*Primary Examiner* — Tuan T Dinh
(74) *Attorney, Agent, or Firm* — JCIPRNET

(57) ABSTRACT

A shield case, joined to a circuit board on which electronic components are mounted and covering the electronic components, has a top plate portion covering the electronic components, and a plurality of terminal leg portions formed in a way of projecting in a direction intersecting with the top plate portion from a peripheral edge portion of the top plate portion. Each of the plurality of terminal leg portions has: a leg portion stretching from the top plate portion; a terminal portion which extends in a direction intersecting with the leg portion from a front-end of the leg portion and is joined to the circuit board; and an expansion terminal portion which is formed by bending a front-end portion of each of the terminal portions along an end surface of the circuit board and has a length exceeding a thickness of the circuit board.

9 Claims, 16 Drawing Sheets

(56) References Cited

U.S. PATENT DOCUMENTS

| | | | | |
|---|---|---|---|---|
| 7,277,301 B2 * | 10/2007 | Liang | .................... | H05K 9/0028 |
| | | | | 361/753 |
| 7,358,106 B2 * | 4/2008 | Potter | ................. | B81C 1/00269 |
| | | | | 257/E23.184 |
| 7,929,320 B2 * | 4/2011 | Mashino | ................ | H05K 1/165 |
| | | | | 361/818 |
| 2007/0211445 A1 * | 9/2007 | Robinson | .............. | H01L 23/552 |
| | | | | 361/818 |
| 2010/0085719 A1 * | 4/2010 | Lu | ........................ | H05K 9/0026 |
| | | | | 257/659 |
| 2011/0299262 A1 * | 12/2011 | Crotty | ................ | H01R 13/6271 |
| | | | | 361/818 |
| 2013/0322040 A1 * | 12/2013 | Watanabe | ............ | H05K 9/0024 |
| | | | | 361/760 |
| 2014/0192508 A1 * | 7/2014 | Patil | ....................... | H04B 15/02 |
| | | | | 361/818 |

* cited by examiner

SHIELD CASE AND ELECTRONIC CIRCUIT MODULE

CROSS-REFERENCE TO RELATED APPLICATION

This application claims the priority benefit of Japan application serial no. 2020-057114, filed on Mar. 27, 2020. The entirety of the above-mentioned patent application is hereby incorporated by reference herein and made a part of this specification.

BACKGROUND

Technical Field

The disclosure relates to a shield case and an electronic circuit module in which a board and a shield case are integrated with each other.

Related Art

Recently, it is required that a wireless communication equipment can be used under any environment, and the demand for miniaturization is increased in which the wireless communication equipment is small and can be easily carried to use.

Furthermore, in various countries, as an adaptive condition, an electronic circuit module such as a wireless module or the like mounted inside the wireless communication equipment requires to be shielded by a shield case such as a metal case or the like using a radio certification or the like. In addition, for internal circuit protection, noise countermeasure, or the like of the electronic circuit module, a shield case which covers electronic components attached to a printed-circuit board (hereinafter referred to as the board) of a circuit board is required. For example, the shield case has a structure which is a cubical box structure having no terminal for solder connection, and in which the shield case is mounted on the board and side surfaces of four sides of the shield case are attached to the board by soldering (see Patent literature 1).

LITERATURE OF RELATED ART

Patent Literature

[Patent literature 1] Japanese Patent Laid-Open No. 2016-114695

In the use of the wireless communication equipment, for example, there is a case in which a shrinkage or a warpage of the board occurring if an environmental temperature change is severe, an impact given when the equipment is dropped during carrying, a bending warpage given when the electronic circuit module is put into a space which is not large enough, or the like applies a large stress to a solder joint part of the shield case of the equipment, and a defect that the joint part is peeled off is generated. Furthermore, as well when the electronic circuit module is solder-joined to a main board, a defect of electronic circuit module peeling in which a joint part is peeled off may be generated.

In the conventional technology, in order to solve the defect of the peeling, measures are taken in which the number of the soldering parts of the shield case is increased and connection strength is enhanced. In order to increase the number of the soldering parts, it is necessary to reduce a component zone on the board or increase an outside dimension of the board. Furthermore, demerits such as an increase in the amount used of the solders for attaching the shield case, an increase in the time of soldering state inspection of the solder joint parts, and the like are generated.

In addition, because the number of the solder joint parts is excessively increased, there is conversely no part in which the stress is released when the board is warped, and the so-called shield case peeling in which the shield case is peeled off from the board also occurs.

SUMMARY

The disclosure aims to provide a shield case which reduces demerits of the conventional technology and improves defects of shield case peeling and electronic circuit module peeling.

A shield case of the disclosure,
joined to a circuit board on which electronic components are mounted and covering the electronic components, including:
a top plate portion covering the electronic components; and
a plurality of terminal leg portions formed in a way of projecting in a direction intersecting with the top plate portion from a peripheral edge portion of the top plate portion; wherein each of the plurality of terminal leg portions has:
a leg portion stretching from the top plate portion; a terminal portion which extends in a direction intersecting with the leg portion from a front-end of the leg portion and is joined to the circuit board; and
an expansion terminal portion which is formed by bending a front-end portion of each of the terminal portions along an end surface of the circuit board and has a length exceeding a thickness of the circuit board.

According to the disclosure, defects of shield case peeling and electronic circuit module peeling can be improved.

DESCRIPTION OF THE EMBODIMENTS

Hereinafter, examples according to the disclosure are described in detail with reference to the drawings. Besides, in the examples, constituent elements having substantially the same function and configuration are marked with the same signs, and thereby repeated descriptions are omitted.

Example 1

First Example

[Configuration]

Figure 1:
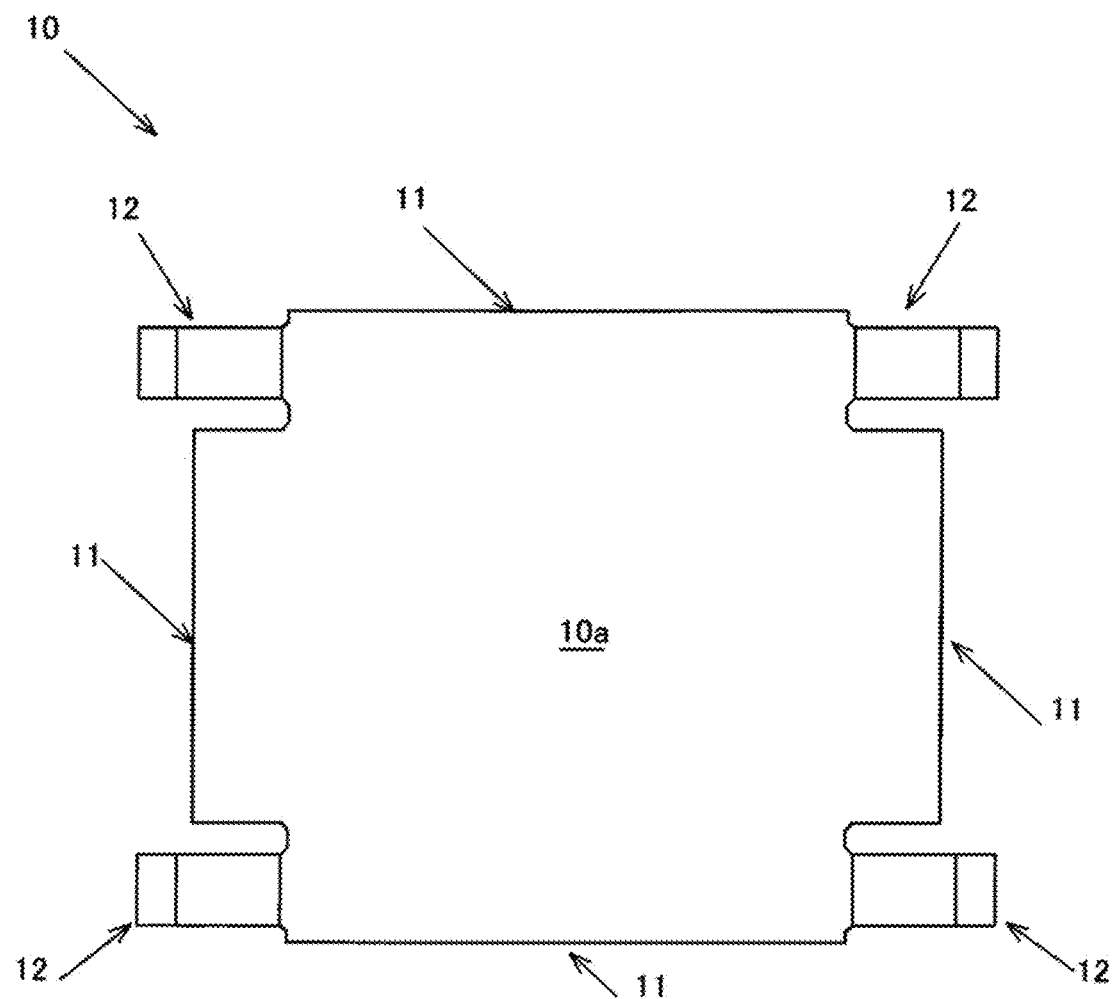
FIG. 1 is a top view of a shield case of an electronic circuit module of a first example according to the disclosure.
Figure 2:
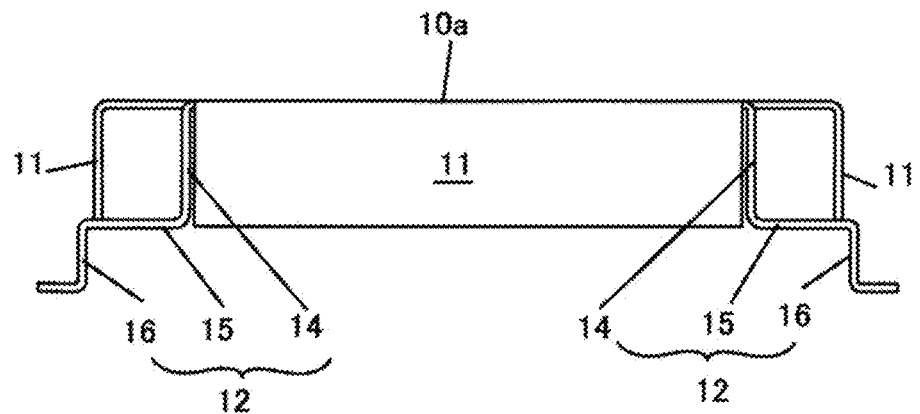
FIG. 2 is a side view of the shield case of the electronic circuit module of the first example.
Figure 3:
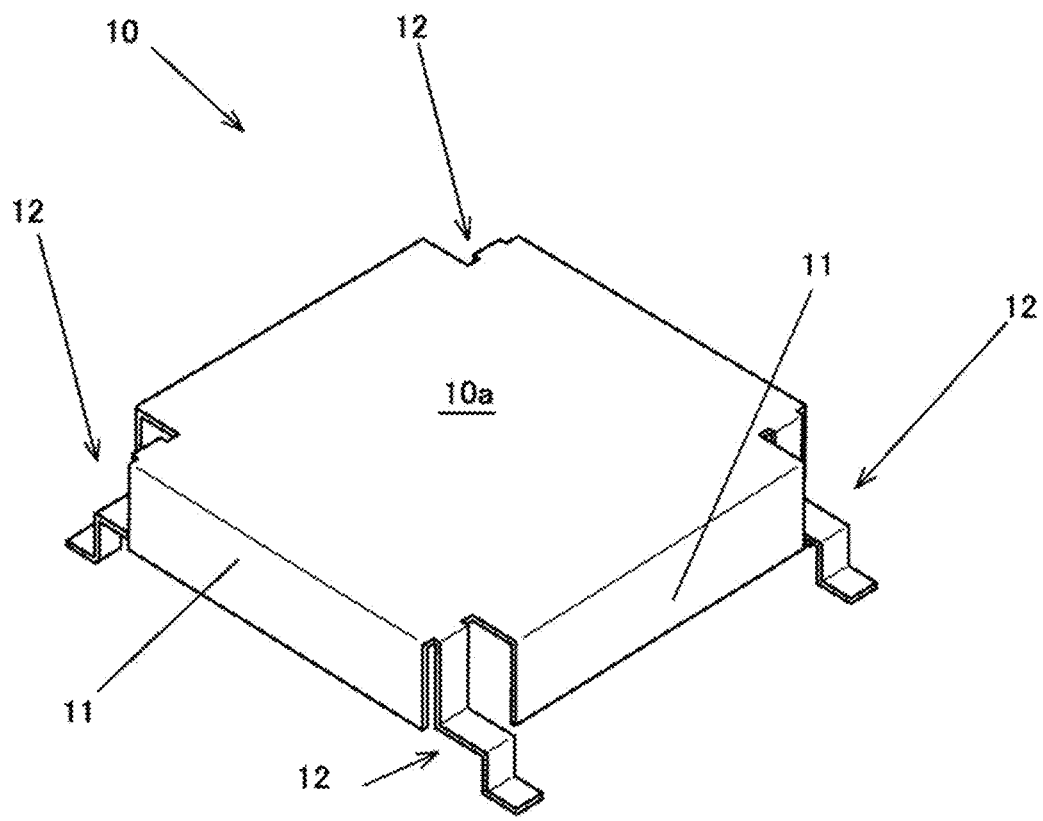
FIG. 3 is a perspective view of the shield case of the electronic circuit module of the first example.

FIG. 1 is a top view of a shield case 10 made of a metal such as copper, iron, an alloy, or the like of a first example. FIG. 2 is a side view of the shield case 10 of the first example. FIG. 3 is a perspective view of the shield case 10 of the first example.

The shield case 10 is a substantially cuboid in which the side of a board PB is open and which has a rectangular top plate 10a, side plate portions 11 that are a pair of sidewalls of two opposed sides, and terminal leg portions 12 formed offset in four corners of the shield case 10. Each of the four terminal leg portions has: a leg portion 14 stretching in a normal direction of the top plate 10a from the top plate 10a; a terminal portion 15 extending in a direction intersecting with the leg portion 14 from a front-end of the leg portion 14; and an expansion terminal portion 16 of a front-end of the terminal portion 15.

The shield case 10 is formed from a metal flat plate by processing of plate metal. The shield case 10 can be formed from the metal flat plate by folding each band-shaped part outward in a direction intersecting with the top plate 10a, the metal flat plate having: the top plate 10a, band-shaped parts serving as the terminal leg portions stretching out from the top plate 10a (the leg portions 14, the terminal portions 15, and the expansion terminal portions 16), and band-shaped parts serving as the side plate portions (the side plate portions 11).

Figure 4:
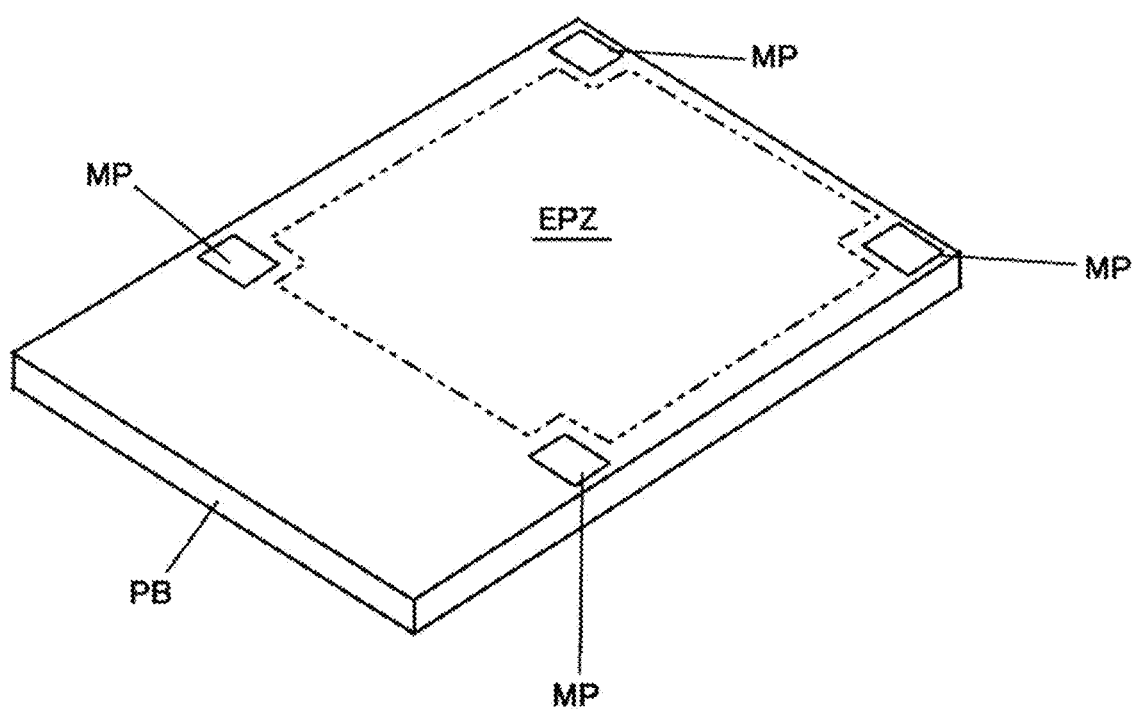
FIG. 4 is a perspective view of a board which is used for the electronic circuit module of the first example and to which the shield case is attached.

FIG. 4 is a perspective view of the board PB for an electronic circuit module (hereinafter referred to as the module) such as a wireless module or the like on which an electronic circuit (not shown) is mounted. On the board PB, metal pads MP consisting of conductor patterns are disposed and formed corresponding to the terminal portions 15 in the four corners of the shield case 10. The shield case 10 is attached to the metal pads MP via solders. The metal pad MP is set at a position where the terminal portion 15 does not protrude with the joined surface of the metal pad MP having an area larger than that of the terminal portion 15. With regard to the dimension of the metal pad MP, a certain extent of area of the metal pad MP is necessary so that a manufacturing tolerance of the shield case 10 is formed and appropriate solder fillets are formed on an outer side and an inner side of the terminal portion 15. The metal pad MP can be disposed in a way of being separated from an end of the board PB by, for example, about 0.3 mm. As shown in FIG. 4, an electronic component mounting surface zone EPZ can be ensured which is obtained by removing the four metal pads MP from a region in which the shield case 10 covers the board PB.

[Module Assembly]

Figure 5:
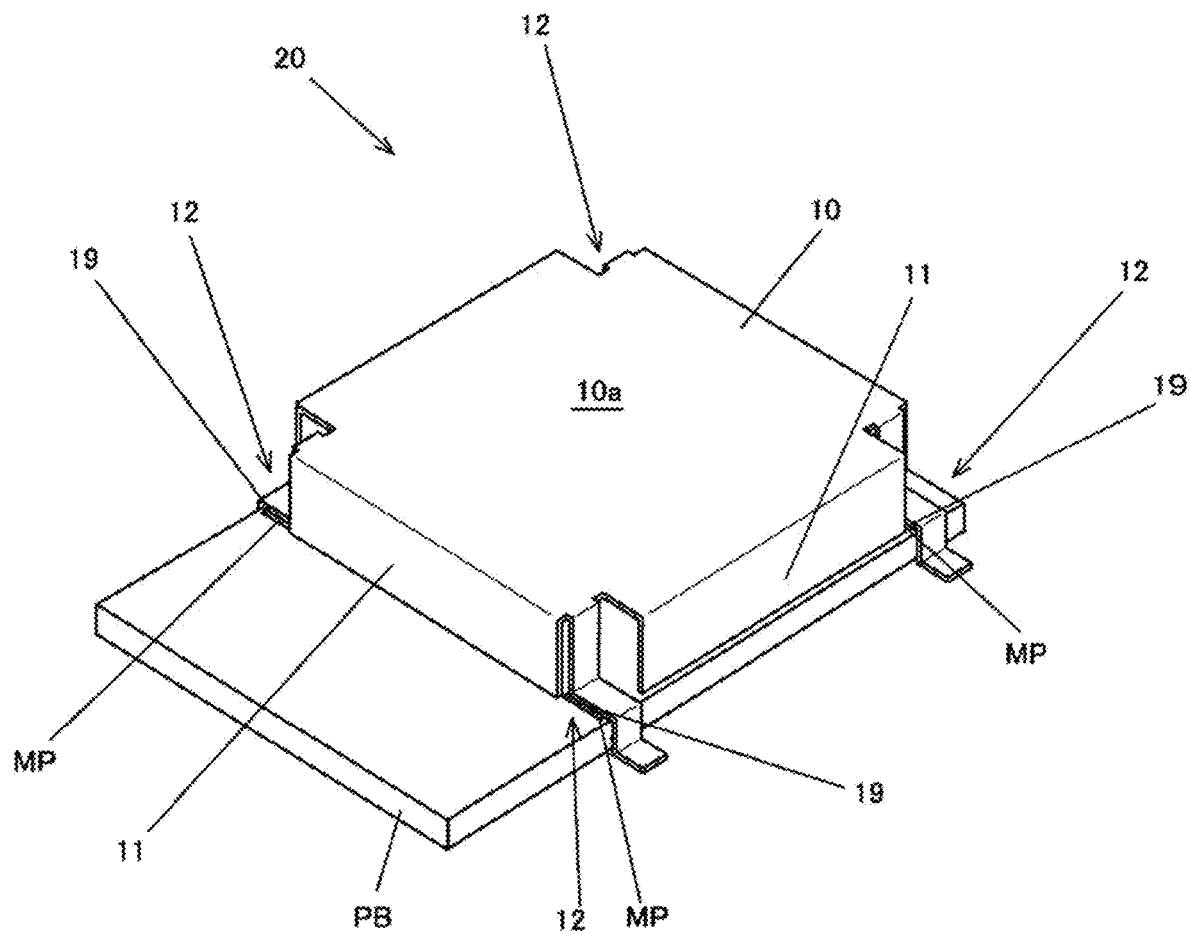
FIG. 5 is a perspective view showing the electronic circuit module of the first example.

For example, if each of the terminal leg portions 12 of the shield case 10 is placed on each of the metal pads MP of the board PB via a solder paste (not shown) and reflow for solder joining is performed, a module 20 formed by attaching the shield case 10 shown in FIG. 5 to the board PB can be obtained.

FIG. 5 is a perspective view showing the module 20 in which the shield case 10 and the board PB are integrated with each other. In this way, the module 20 can be formed by the board PB on which various electronic components (not shown) constituting an electrical circuit are mounted, and the shield case 10 which covers the electronic components on the electrical circuit and is attached via solders 19.

Figure 6:
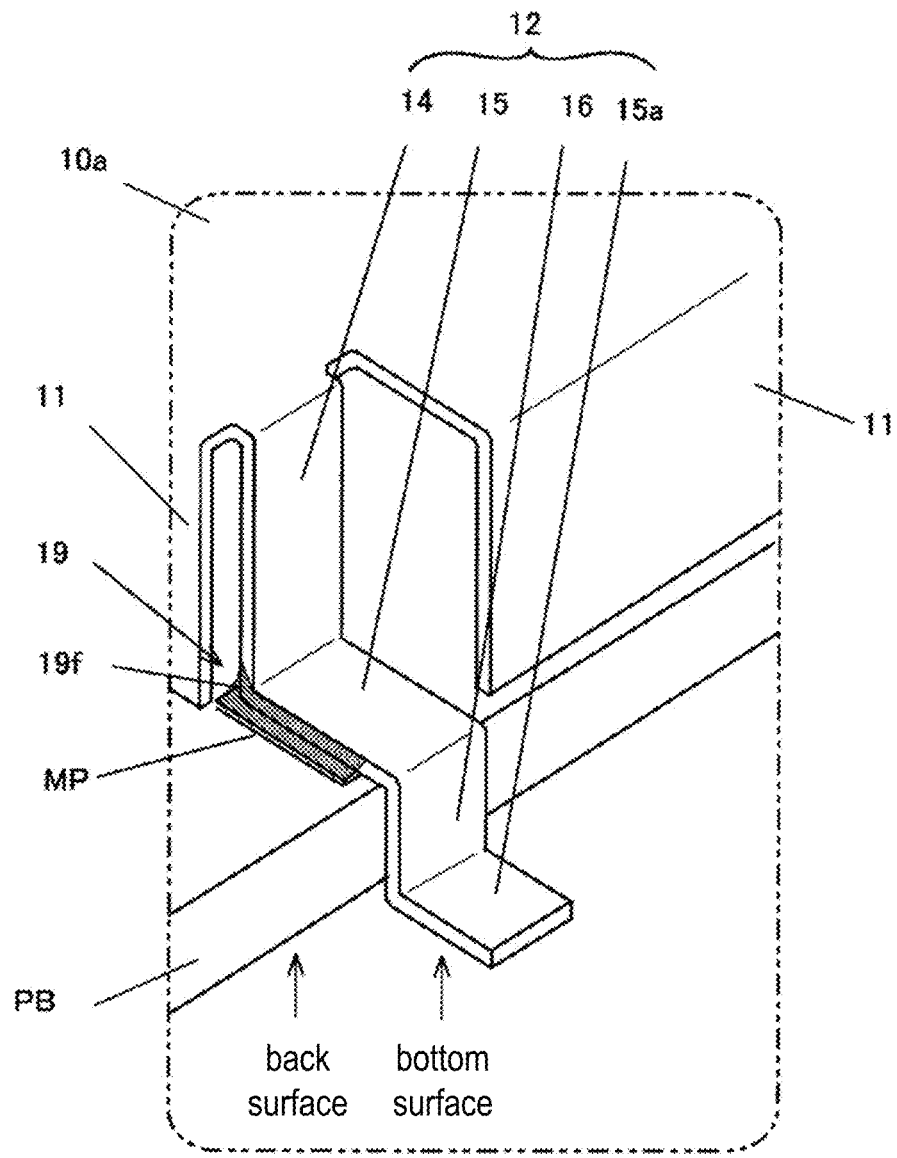
FIG. 6 is a perspective view of the vicinity of a terminal leg portion of the shield case in the electronic circuit module of the first example.

FIG. 6 is a perspective view of the vicinity of the terminal leg portion 12 of the shield case 10 in the module 20. During solder heating such as the reflow or the like, the melted solder 19 spreads between the terminal portion 15 and the metal pad MP. In addition, because the terminal portion 15 has a width narrower than a width of the metal pad MP, solder fillets 19f are formed on both sides of the terminal portion 15 and a side of the leg portion 14.

As shown in FIG. 6, the expansion terminal portion 16 is formed by bending a front-end portion of the terminal portion 15 along an end surface of the board PB and has a length exceeding a thickness of the board PB. The expansion terminal portion 16 may be separated from the end surface of the board PB as shown in FIG. 6, or may abut against the end surface of the board PB although not shown. Thereby, the degree of design freedom with a main board (not shown) on which the module 20 is to be mounted is increased.

The expansion terminal portion 16 has a second terminal portion 15a on a front-end of the expansion terminal portion 16, and the second terminal portion 15a is a joined portion which is bent in an outer direction intersecting with the end surface of the board PB and which has a bottom surface along a back surface opposite to the electronic component mounting surface zone EPZ (see FIG. 4).

[Mounting to Main Board]

Figure 7:
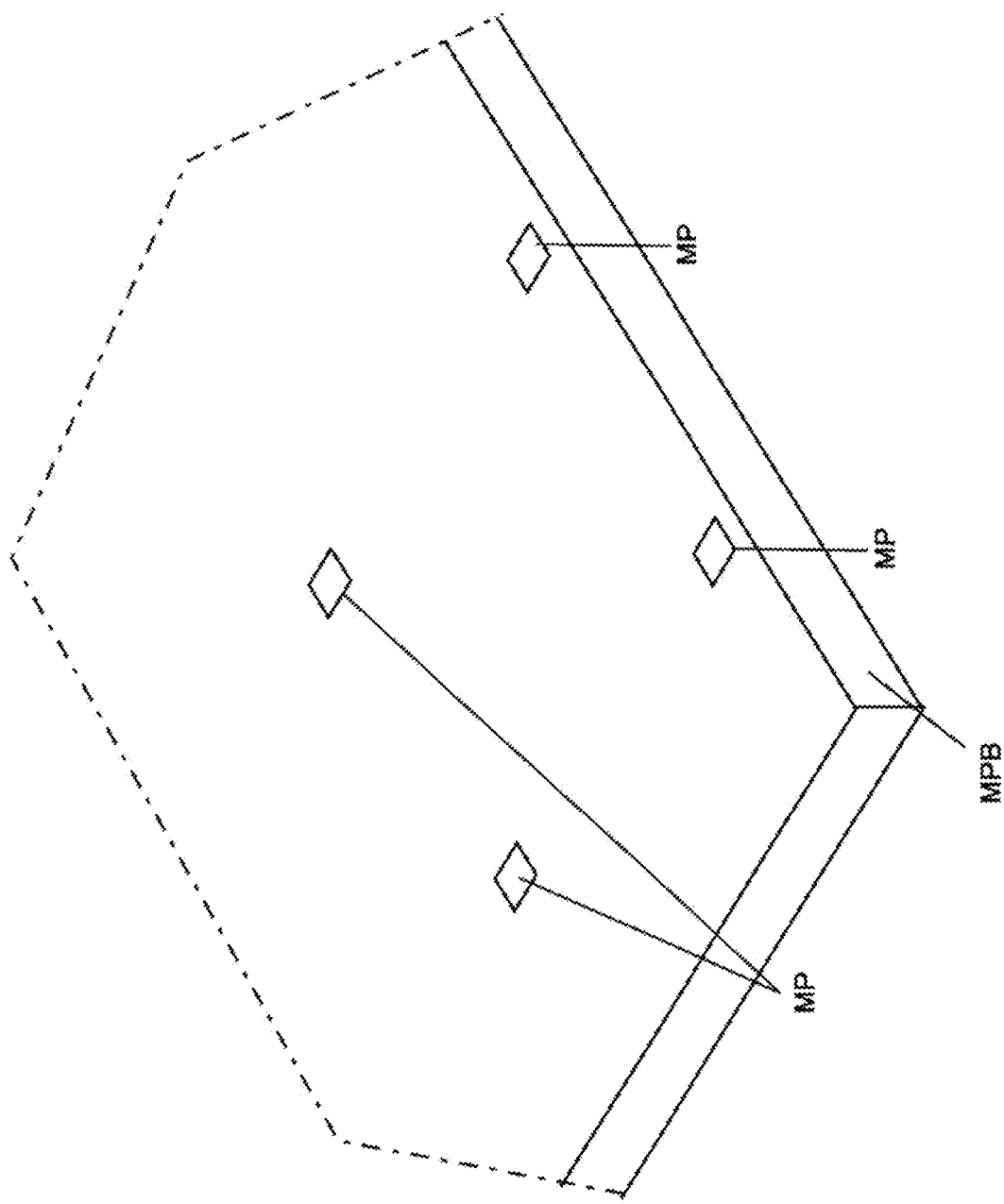
FIG. 7 is a perspective view of a main board on which the electronic circuit module of the first example is mounted.

FIG. 7 is a perspective view of a main board MPB which is used for, for example, a communication-terminal and on which the module is mounted. On the main board MPB, the metal pads MP consisting of conductor patterns are disposed and formed corresponding to the second terminal portions 15a of the front-ends of the terminal portions 15 in the four corners of the shield case 10 of the module 20. Each of the second terminal portions 15a is attached to each of the metal pads MP via a solder. The metal pad MP is set at a position where the second terminal portion 15a does not protrude with the joined surface of the metal pad MP having an area larger than that of the second terminal portion 15a. With regard to the dimension of the metal pad MP, a certain extent of area of the metal pad MP is necessary so that a manufacturing tolerance of the shield case 10 of the module 20 is formed and appropriate solder fillets are formed on an outer side and an inner side of the second terminal portion 15a. The metal pad MP can be disposed in a way of being separated from an end of the main board MPB by, for example, about 0.3 mm.

Figure 8:
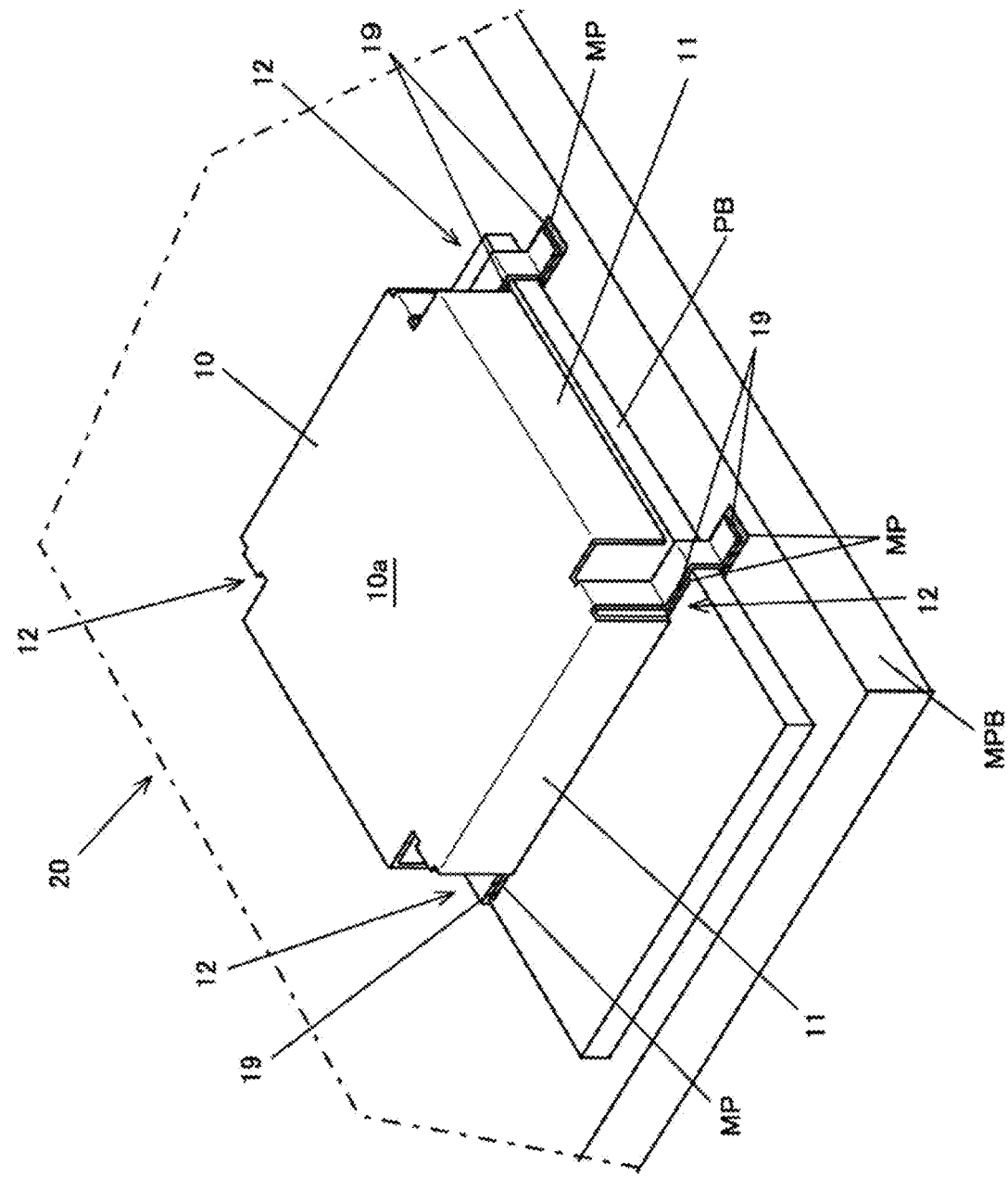
FIG. 8 is a perspective view showing an assembly board in which the electronic circuit module of the first example and the main board are integrated with each other.

For example, if the second terminal portion 15a of each of the terminal leg portions 12 (the expansion terminal portion 16) of the shield case 10 is placed on each of the metal pads MP of the main board MPB via a solder paste (not shown) and reflow for solder joining is performed, an assembly board formed by attaching the module 20 shown in FIG. 8 to the main board MPB can be obtained.

FIG. 8 is a perspective view showing the assembly board in which the module 20 and the main board MPB are integrated with each other. In this way, the module 20 mounted on the main board MPB is configured by the board PB on which various electronic components (not shown) constituting an electrical circuit are mounted, and the shield case 10 which covers the electronic components on the electrical circuit and has the expansion terminal portion 16 for the joining of the main board MPB.

Figure 9:
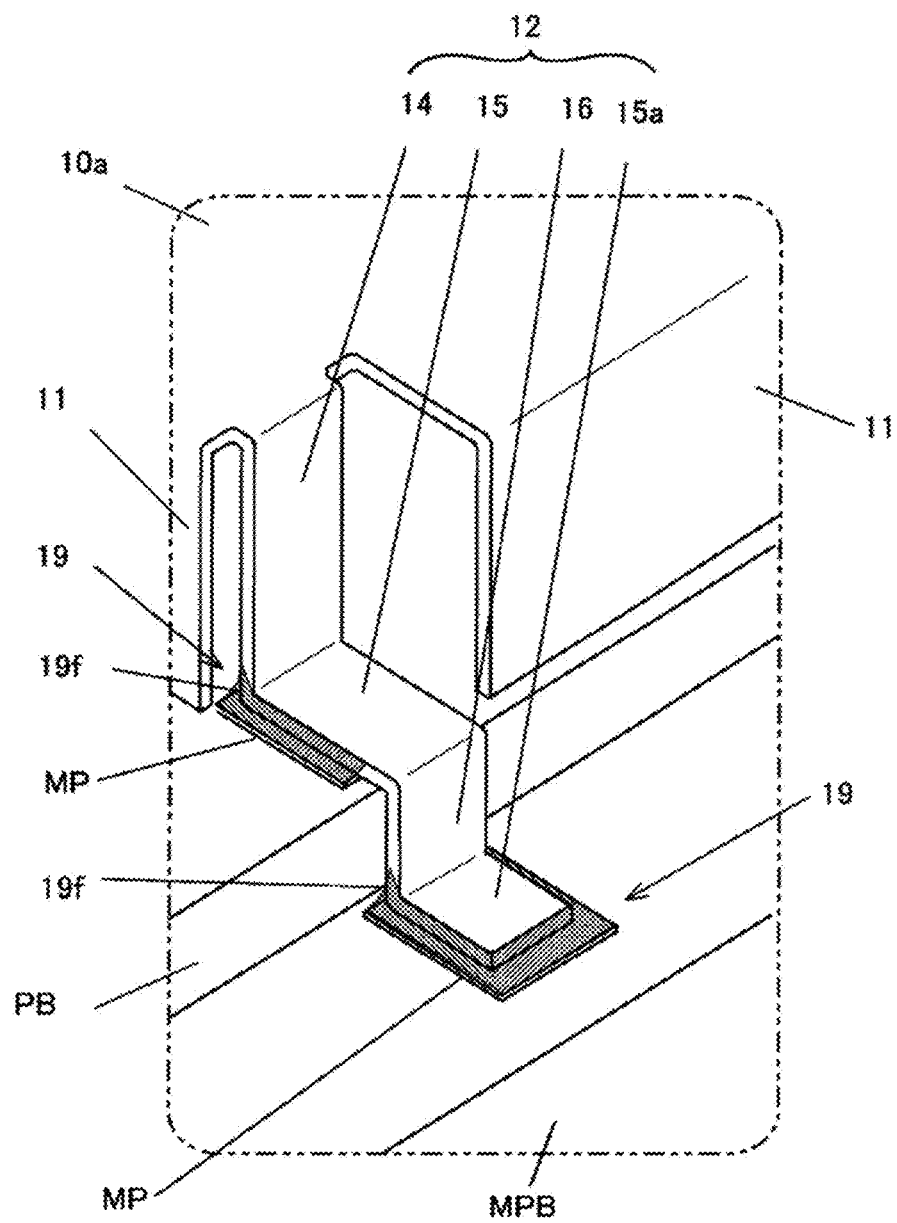
FIG. 9 is a perspective view of the vicinity of a terminal leg portion of the shield case in the electronic circuit module of the first example.

FIG. 9 is a perspective view of the vicinity of the terminal leg portion 12 of the shield case 10 in the module 20. During solder heating such as the reflow or the like, the melted solder 19 spreads between the second terminal portion 15a and the metal pad MP. In addition, because a bottom surface of the second terminal portion 15a has an area smaller than an area of the metal pad MP, the solder fillets 19f are formed which spread around the second terminal portion 15a, especially on an expansion terminal portion 16 side.

[Effect]

According to the example, because the expansion terminal portion 16 (the second terminal portion 15a) is set on the front-end of the terminal portion 15, the joining area of the solder is increased. Accordingly, the joining strength of the module 20 and the shield case 10 can be more increased. Thereby, an effect can be expected in which the peeling of the shield case 10 from the board PB and the peeling of the module 20 from the main board MPB are suppressed by setting the expansion terminal portions expanding to the main board MPB on which the module 20 is mounted.

Example 2

Second Example

Figure 10:
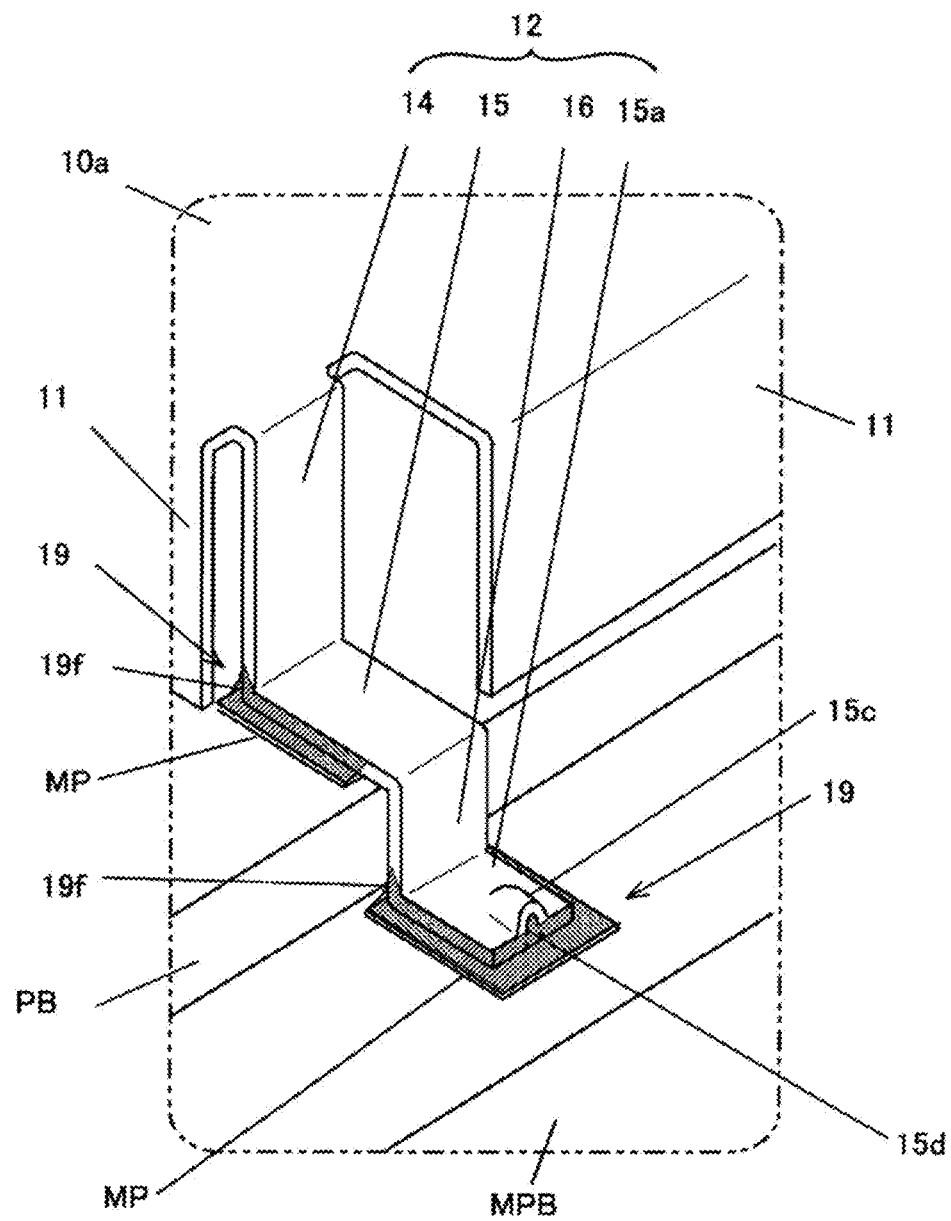
FIG. 10 is a perspective view of the vicinity of a terminal leg portion of a shield case in an electronic circuit module of a second example.

FIG. 10 shows a perspective view of the vicinity of the terminal leg portion 12 of a main portion of the module 20 of the example. The module 20 of the example has the same configuration as in the first example except that in the expansion terminal portion 16 of the terminal leg portion 12 of the shield case 10, a projection portion 15c projecting in a normal direction of a joined surface of the second terminal portion 15a is set on a front-end of the second terminal portion 15a so that a groove extending in a longitudinal direction of the joined surface of the second terminal portion 15a, that is, a recessed portion 15d is formed.

In the module 20 of the example, during the solder joining, the solder is filled into the recessed portion 15d in addition to the solder fillets 19f around the second terminal portion 15a. Accordingly, because a contact surface of the solder with the second terminal portion 15a of the expansion terminal portion extends in a normal direction of the board (the recessed portion 15d), durability against deviation toward a board mounting surface direction can be expected.

Because the solder 19 is filled in the recessed portion 15d of the second terminal portion 15a, in addition to the effect of the first example, the joining area between the solder 19 and the shield case 10 (the terminal portion 15, the second terminal portion 15a, and the recessed portion 15d) can be increased, and the joining strength of the shield case 10 can be further improved.

Figure 11:
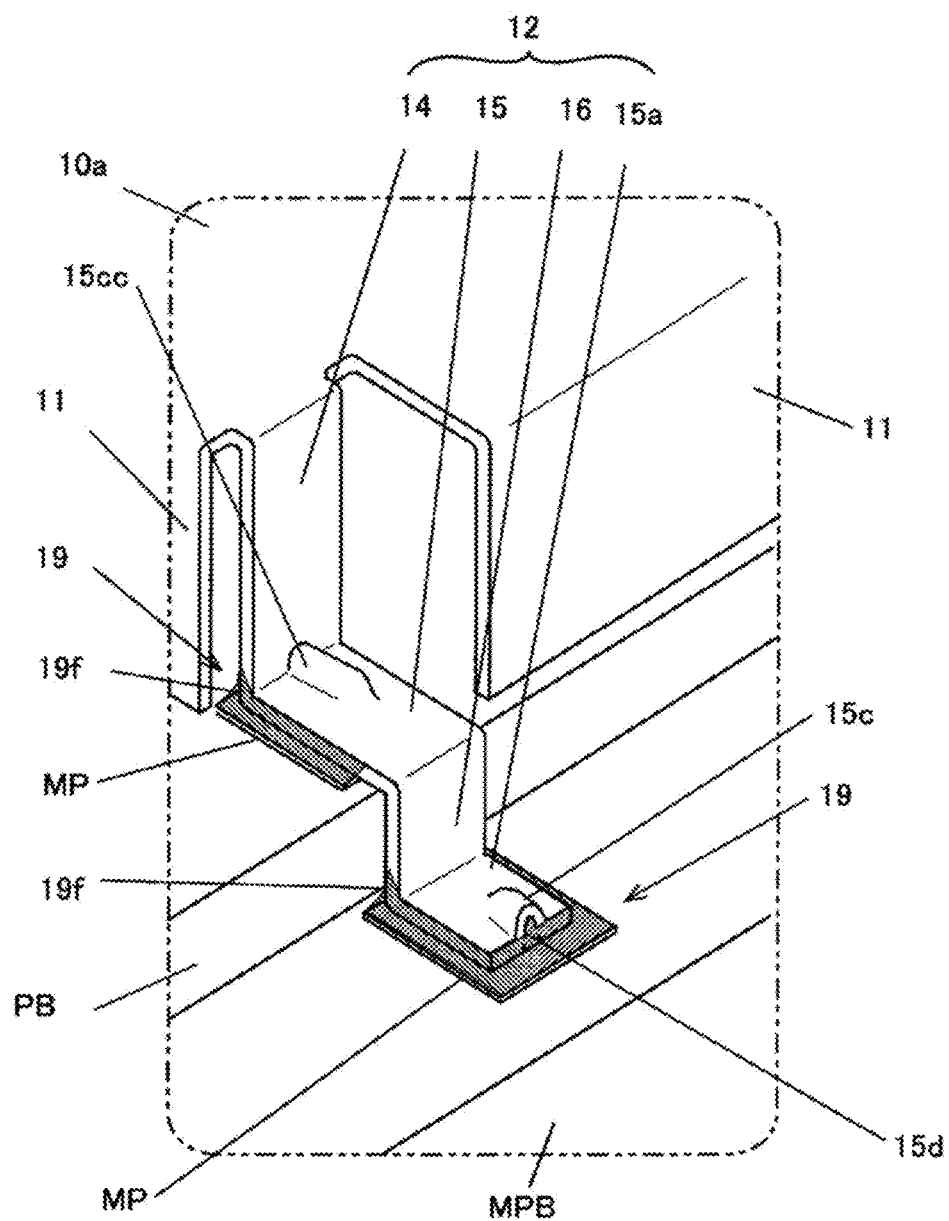
FIG. 11 is a perspective view of the vicinity of a terminal leg portion of a shield case in an electronic circuit module of a variation example of the second example.

Besides, the number of the terminal portions 15 and the number of the recessed portions 15d of the second terminal portions 15a may be plural, and an elongation direction of the recessed portion 15d can be arbitrarily set. For example, FIG. 11 shows a perspective view of the vicinity of the terminal leg portion 12 of the main portion of the module 20 of a variation example of the example. In this variation example, a recessed portion is also set on a joined surface of the terminal portion 15 on a module 20 side, and a projection portion 15cc projecting in a normal direction of the joined surface is set on a leg portion 14 side of the terminal portion 15 in which the solder 19 is filled in the recessed portion. Thereby, the joining area can be expected to be further increased, and the joining strength of the shield case 10 can be expected to be further improved. In addition, the recessed portion may be set only on the joined surface of the terminal portion 15 without setting the projection portion 15c (the recessed portion 15d) on a second terminal portion 15a side.

Example 3

Third Example

Figure 12:
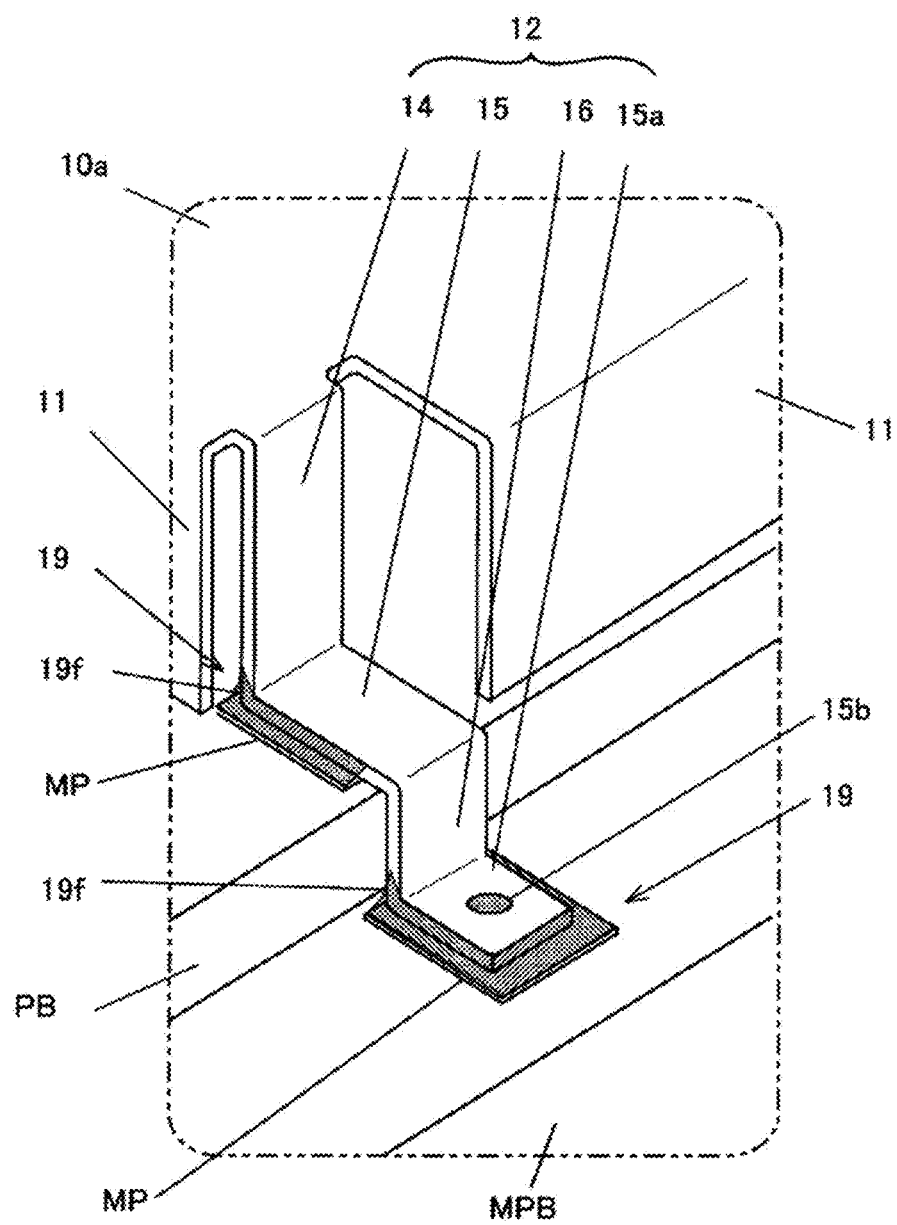
FIG. 12 is a perspective view of the vicinity of a terminal leg portion of a shield case in an electronic circuit module of a third example.

FIG. 12 shows a perspective view of the vicinity of the terminal leg portion 12 of the main portion of the module 20 of the example. The module 20 of the example has the same configuration as in the first example except that in the expansion terminal portion 16 of the terminal leg portion 12 of the shield case 10, a penetration hole 15b is set on a center portion of the joined surface of the second terminal portion 15a.

In the module 20 of the example, during the solder joining, the solder is filled into the penetration hole 15b in addition to the solder fillets 19f around the second terminal portion 15a. Accordingly, because a contact surface of the solder with the second terminal portion 15a of the expansion terminal portion extends in the normal direction of the board (the penetration hole 15b), durability against deviation toward the board mounting surface direction can be expected.

Because the solder 19 is filled in the penetration hole 15b of the second terminal portion 15a, in addition to the effect of the first example, the joining area between the solder 19 and the shield case 10 (the terminal portion 15, the second terminal portion 15a, and the penetration hole 15b) can be increased, and the joining strength of the shield case 10 can be further improved. That is, because the penetration hole 15b is set in the second terminal portion 15a, more solder fillets 19f are formed on an inner peripheral wall of the penetration hole 15b, and the joining strength of the shield case 10 can be more improved.

Figure 13:
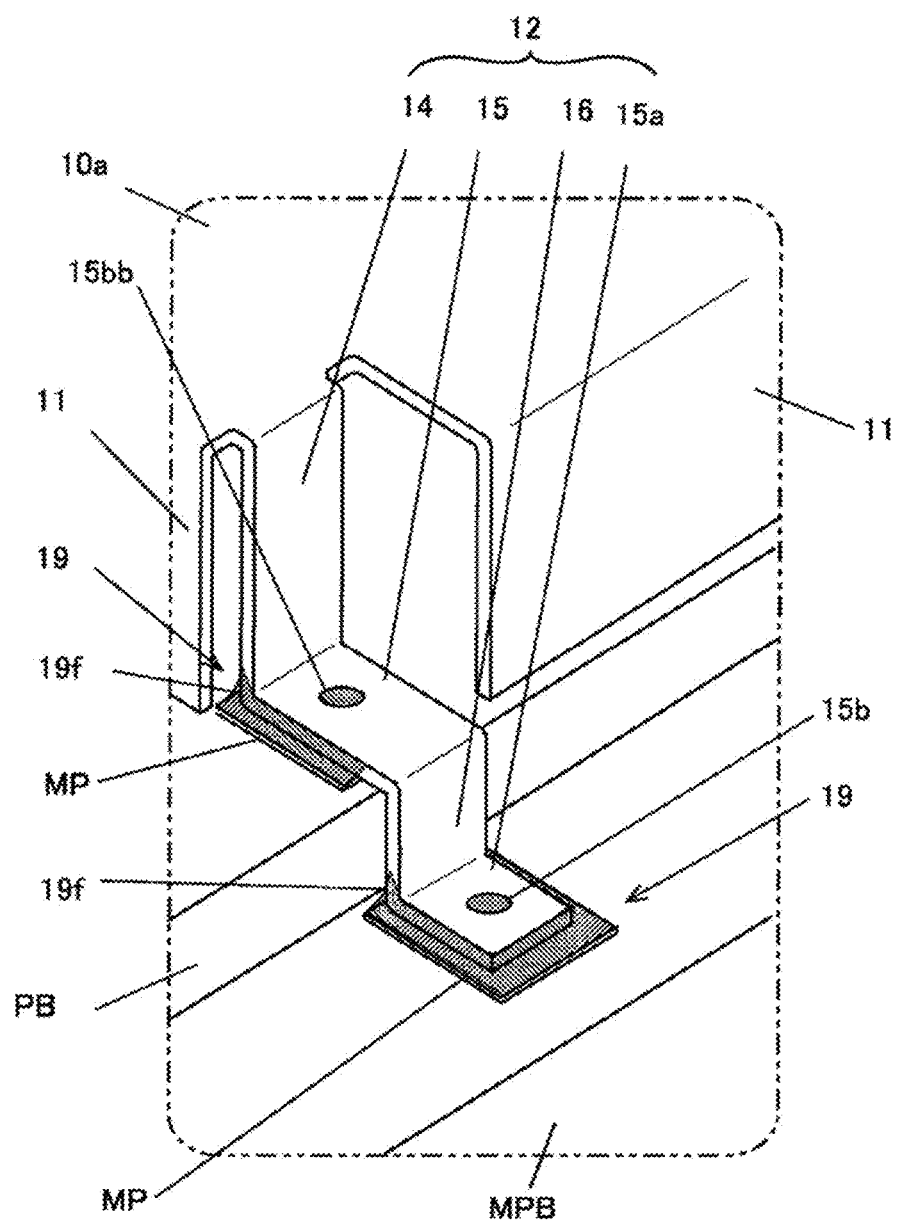
FIG. 13 is a perspective view of the vicinity of a terminal leg portion of a shield case in an electronic circuit module of a variation example of the third example.

Besides, the number of the terminal portions 15 and the number of the penetration holes 15b of the second terminal portions 15a may be plural, and an arrangement direction when the number of the penetration holes 15b is plural can be arbitrarily set. For example, FIG. 13 shows a perspective view of the vicinity of the terminal leg portion 12 of the main portion of the module 20 of a variation example of the example. In a configuration of this variation example, a penetration hole 15bb is also set at the center on the joined surface of the terminal portion 15 on the module 20 side, and the solder 19 is filled in the penetration hole 15bb. Thereby, the joining area can be expected to be further increased, and the joining strength of the shield case 10 can be expected to be further improved. In addition, the penetration hole 15*bb* may be set only on the joined surface of the terminal portion 15 without setting the penetration hole 15*b* on the second terminal portion 15*a* side.

Furthermore, as a variation example, a penetration hole can also be set so as to penetrate the projection portion 15*c* for the recessed portion 15*d* of the second example described above. According to the variation example, in addition to the effects of the first to third examples, the joining strength of the shield case 10 can also be expected to be improved corresponding to the increase in the joining area.

Example 4

Fourth Example

Figure 14:
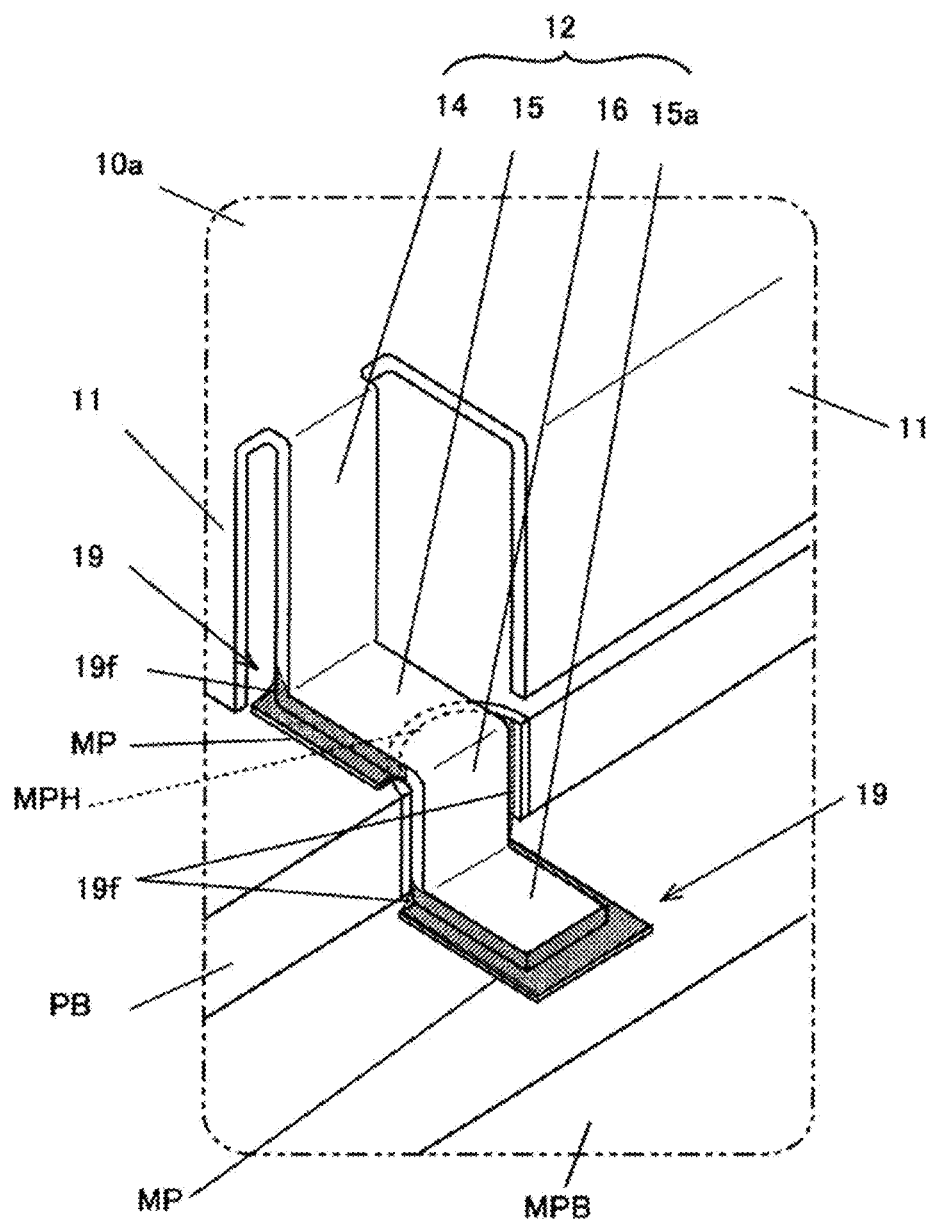
FIG. 14 is a perspective view of the vicinity of a terminal leg portion of a shield case in an electronic circuit module of a variation example of the fourth example.

FIG. 14 shows a perspective view of the vicinity of the terminal leg portion 12 of the main portion of the module 20 of the example. The module 20 of the example has the same configuration as in the first example except that a through-hole MPH is formed so as to be fitted into the expansion terminal portion 16 of the terminal leg portion 12 of the shield case 10, wherein the through-hole MPH is a groove-type metal pad which is set on the board end surface and continues from the metal pad MP on an upper surface of the board PB (in a position separated from the end surface of the board PB).

In the module 20 of the example, during the solder joining of the module assembly, solders are respectively filled between the terminal portion 15 of the terminal leg portion 12 of the shield case 10 and the metal pad MP of the board PB, and between the expansion terminal portion 16 and the through-hole MPH of the board PB end surface.

Thereby, according to the module 20 of the example, in the shield case 10 mounted on the board PB, an increase in the solder joining strength with the through-hole MPH extending in a direction perpendicular to a direction spreading out on the mounting surface of the board PB can be expected, and the shield case 10 can be mounted extremely close to the end surface of the board PB having the through-hole MPH.

In addition, in the module 20 of the example, during the solder joining to the main board MPB, the solder can be filled into the through-hole MPH in addition to the solder fillets 19*f* around the second terminal portion 15*a*. Accordingly, because the through-hole MPH extends in the normal direction of the board, durability against deviation toward the board mounting surface direction can be expected.

Example 5

Fifth Example

Figure 15:
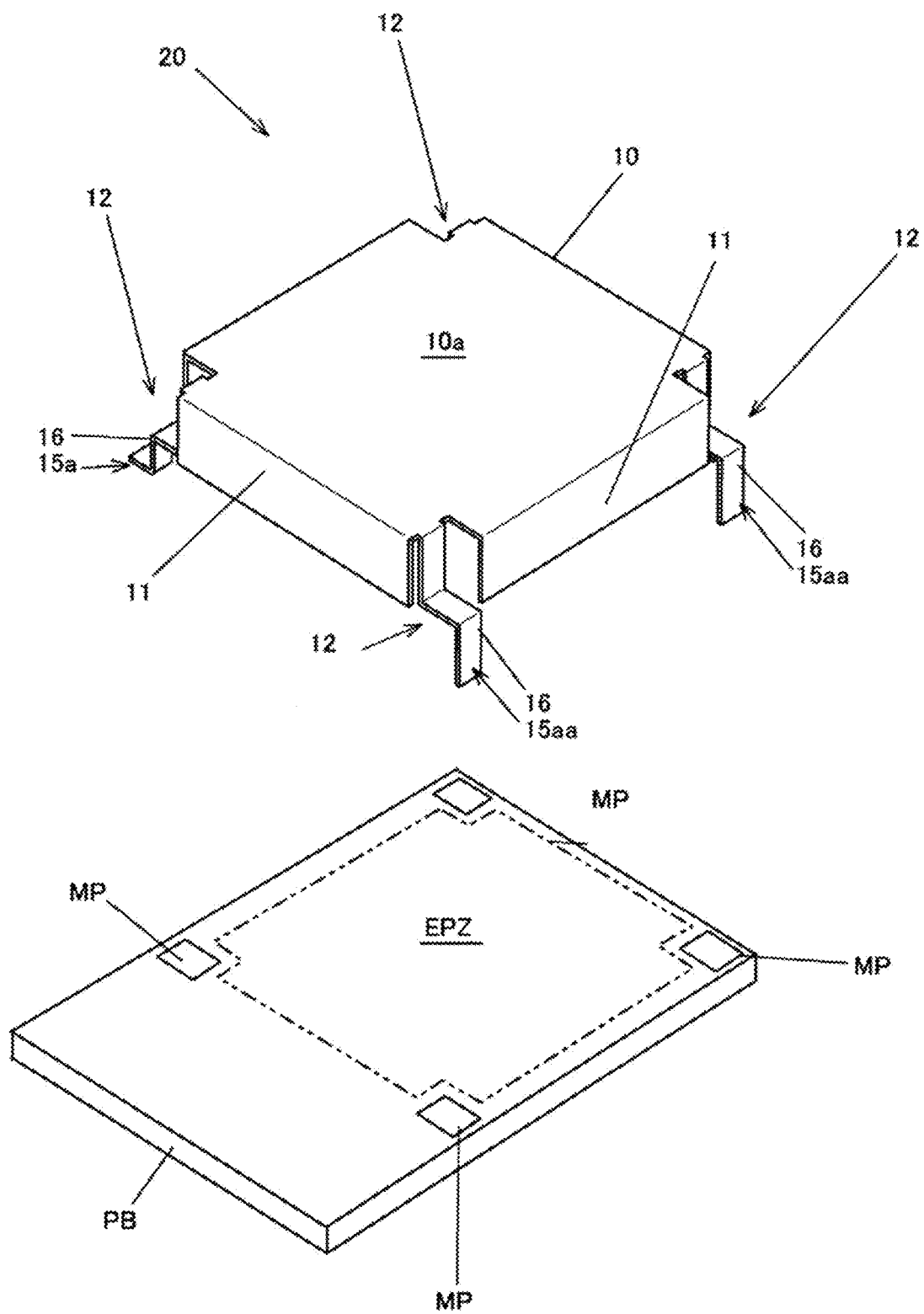
FIG. 15 is an exploded perspective view of a module of a fifth example.

FIG. 15 shows an exploded perspective view of the module 20 of the example. The module 20 of the example has the same configuration as in the first example except that in the expansion terminal portion 16 of the terminal leg portion 12 of the shield case 10, in addition to the second terminal portion 15*a*, a third terminal portion 15*aa* is included which is a joined portion elongating in a direction parallel to the end surface of the board PB.

Figure 16:
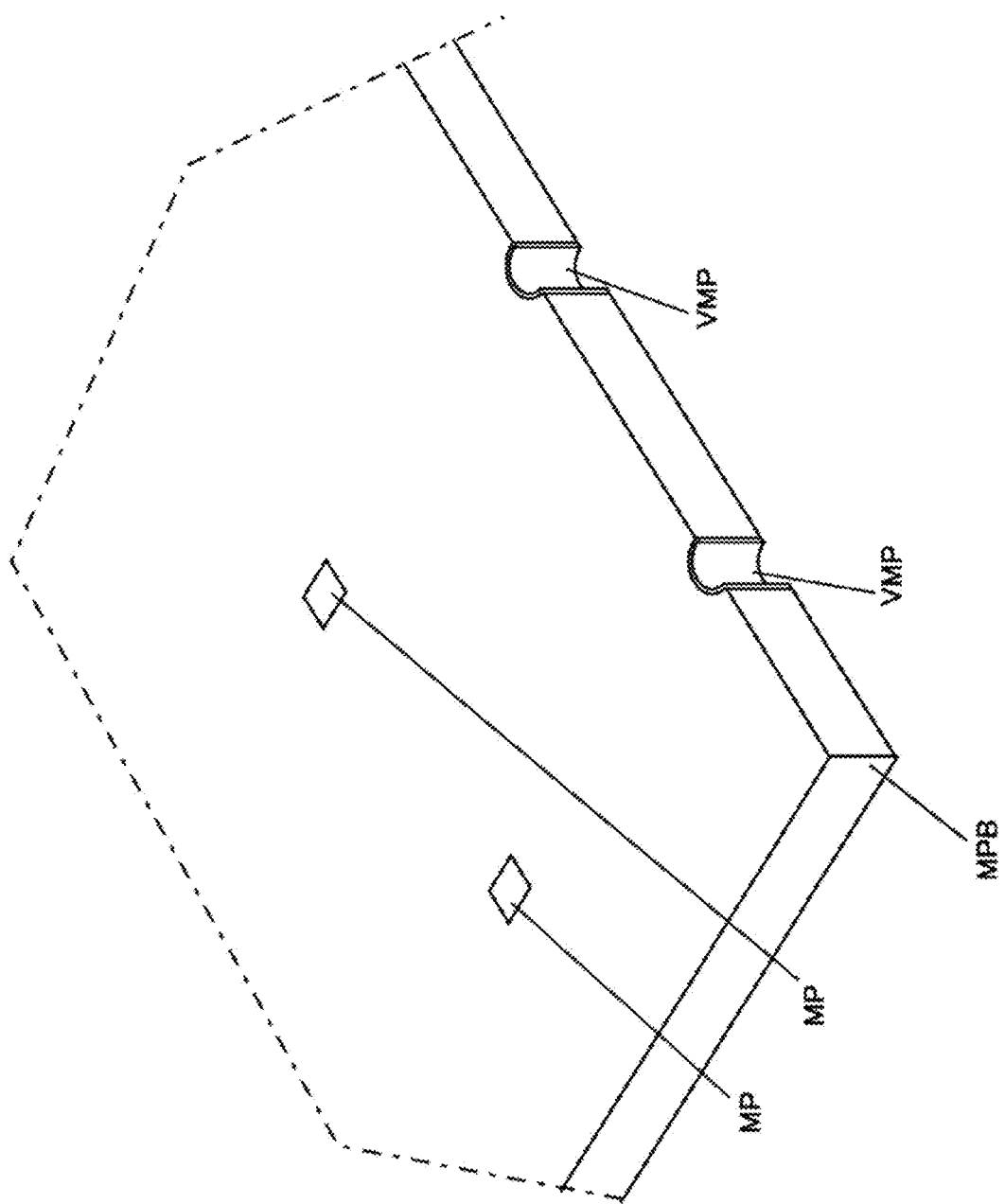
FIG. 16 is a perspective view of a main board on which the electronic circuit module of the fifth example is mounted.

FIG. 16 is a perspective view of the main board MPB which is used for, for example, a communication-terminal and on which the module 20 of the example is mounted. The metal pads MP consisting of conductor patterns on an upper surface of the main board MPB (in a position separated from an end surface of the main board MPB) and groove-type metal pads VMP set on the end surface are disposed and formed corresponding to the second terminal portions 15*a* and the third terminal portions 15*aa* of the shield case 10 of the module 20.

In the module 20 of the example, during the solder joining, solders are respectively filled between the second terminal portion 15*a* of the module 20 of the example and the metal pad MP, and between the third terminal portion 15*aa* and the groove-type metal pad VMP.

Figure 17:
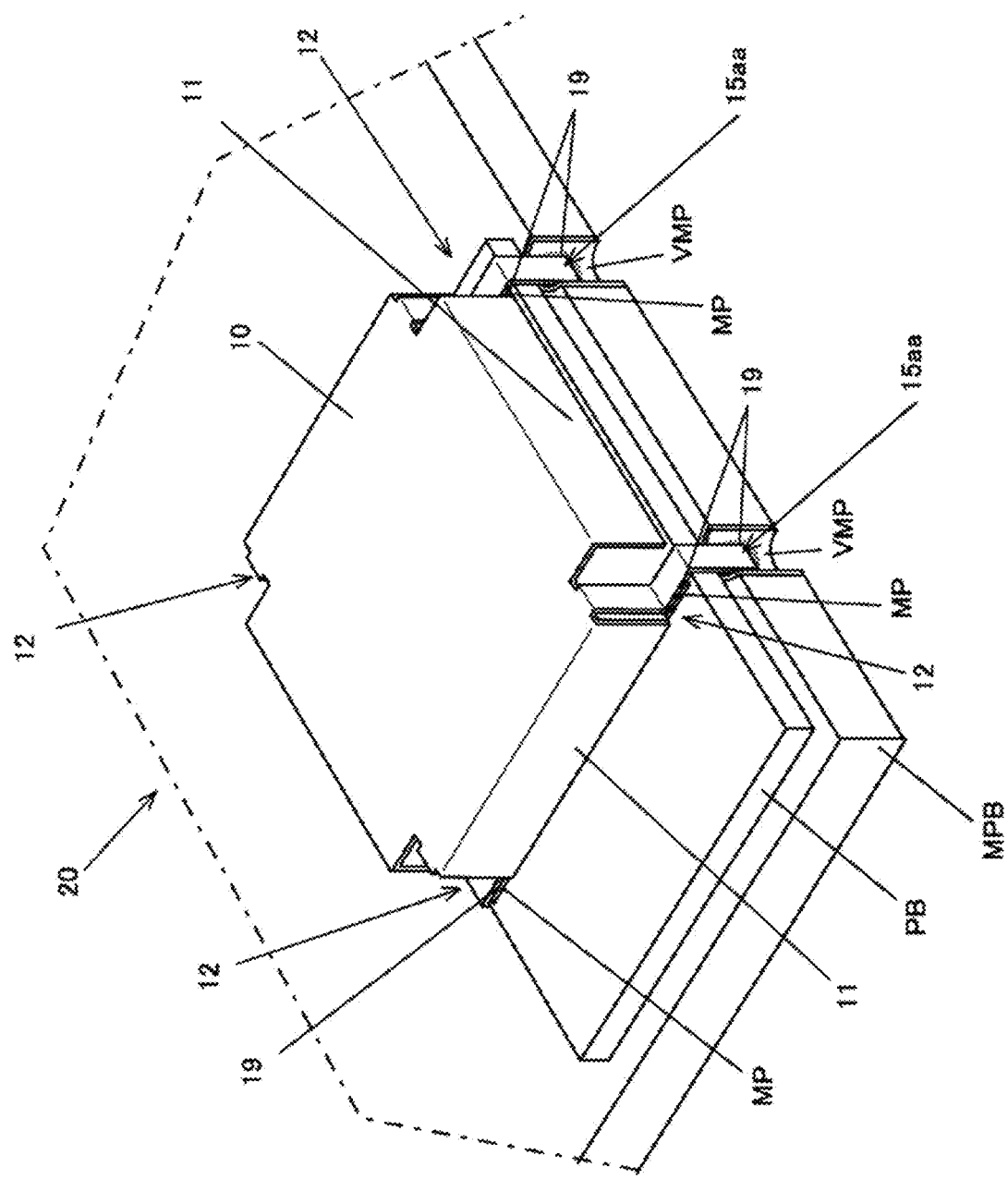
FIG. 17 is a perspective view showing an assembly board in which the electronic circuit module of the fifth example and the main board are integrated with each other.

FIG. 17 is a perspective view showing an assembly board in which the module 20 of the example and the main board MPB are integrated with each other. In this way, according to the module 20 of the example, with regard to the module 20 mounted on the main board MPB, an increase in the solder joining strength in a direction perpendicular to a direction spreading out on each of the mounting surfaces of the main board MPB and the board PB can be expected, and the module 20 can be mounted extremely close to the end surface of the main board MPB having the groove-type metal pad VMP.

Any one of the examples can be used in, for example, a module including a shield case which shields a high frequency and a communication device such as a mobile-phone, a personal digital assistant, or the like using the module.

What is claimed is:

1. A shield case, joined to a circuit board and covering an electronic component mounting surface zone of the circuit board, comprising:
   a top plate portion covering the electronic components; and
   a plurality of terminal leg portions formed in a way of projecting in a direction intersecting with the top plate portion from a peripheral edge portion of the top plate portion; wherein
   each of the plurality of terminal leg portions has:
   a leg portion stretching from the top plate portion; a terminal portion which extends in a direction intersecting with the leg portion from a front-end of the leg portion and is joined to the circuit board;
   an expansion terminal portion which is formed by bending a front-end portion of each of the terminal portions along an end surface of the circuit board and has a length exceeding a thickness of the circuit board, wherein the expansion terminal portion has a joined portion; and
   a recessed portion on a joined surface of each of the terminal portions that is joined to the circuit board or on the bottom surface of the joined portion.

2. The shield case according to claim 1, wherein the joined portion is bent in a direction intersecting with the end surface of the circuit board and which has a bottom surface along a back surface opposite to the mounting surface.

3. The shield case according to claim 1, further comprising a penetration hole on the joined surface of each of the terminal portions that is joined to the circuit board or on the bottom surface of the joined portion.

4. The shield case according to claim 1, wherein the joined portion elongating in a direction parallel to the end surface of the circuit board.

5. The shield case according to claim 1, further comprising a side plate portion formed in a way of projecting in the direction intersecting with the top plate portion from the peripheral edge portion of the top plate portion except the plurality of terminal leg portions.

6. The shield case according to claim 2, further comprising a penetration hole on the joined surface of each of the terminal portions that is joined to the circuit board or on the bottom surface of the joined portion.

7. The shield case according to claim 2, wherein each of the expansion terminal portions abuts against the end surface of the circuit board.

8. The shield case according to claim 2, wherein each of the expansion terminal portions is separated from the end surface of the circuit board.

9. An electronic circuit module, comprising:
a circuit board having an electronic component mounting surface zone; and a shield case that is joined to the circuit board and covers the electronic component mounting surface zone of the circuit board; wherein
the shield case has: a top plate portion covering the electronic components, and a plurality of terminal leg portions formed in a way of projecting in a direction intersecting with the top plate portion from a peripheral edge portion of the top plate portion;
each of the plurality of terminal leg portions has:
a leg portion stretching from the top plate portion; a terminal portion which extends in a direction intersecting with the leg portion from a front-end of the leg portion and is joined to the circuit board;
an expansion terminal portion which is formed by bending a front-end portion of each of the terminal portions along an end surface of the circuit board and has a length exceeding a thickness of the circuit board, wherein the expansion terminal portion has a joined portion; and
a recessed portion on a joined surface of each of the terminal portions that is joined to the circuit board or on the bottom surface of the joined portion.

\* \* \* \* \*